(12) United States Patent
Jeong

(10) Patent No.: US 7,598,674 B2
(45) Date of Patent: Oct. 6, 2009

(54) PLASTIC CHASSIS AND PLASMA DISPLAY DEVICE INCLUDING THE SAME

(75) Inventor: Kwang Jin Jeong, Yongin-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 413 days.

(21) Appl. No.: 11/445,478

(22) Filed: May 31, 2006

(65) Prior Publication Data

US 2006/0279189 A1 Dec. 14, 2006

(30) Foreign Application Priority Data

Jun. 1, 2005 (KR) .............. 10-2005-0046850

(51) Int. Cl.
*H01J 17/49* (2006.01)
(52) U.S. Cl. ................ 313/582; 313/586
(58) Field of Classification Search ........ 313/582–587; 361/44, 718; 439/95
See application file for complete search history.

(56) References Cited

U.S. PATENT DOCUMENTS

| 2002/0195937 A1 | 12/2002 | Kim | |
| 2006/0245167 A1* | 11/2006 | Jeong | ............... 361/718 |

FOREIGN PATENT DOCUMENTS

KR 2003043517 A * 6/2003

OTHER PUBLICATIONS

English translation of Office Action dated Feb. 20, 2009, for corresponding Chinese Patent Application No. 200610099859 listing the cited reference.

* cited by examiner

*Primary Examiner*—Vip Patel

(57) ABSTRACT

A plastic chassis for a display device, the plastic chassis having an integrally formed chassis base and support frame. A support body joins the chassis base and the support frame.

16 Claims, 3 Drawing Sheets

PLASTIC CHASSIS AND PLASMA DISPLAY DEVICE INCLUDING THE SAME

BACKGROUND OF THE INVENTION

This application claims priority to and the benefit of Korean Patent Application No. 10-2005-0046850, filed on Jun. 1, 2005, in the Korean Intellectual Property Office, the entire content of which is incorporated herein by reference.

1. Field of the Invention

The present invention relates to a plasma display device, and more particularly, to a plasma display device including a plastic chassis.

2. Description of Related Art

Recently, improvements for flat panel display devices have been actively researched. An example of such a flat panel display device is a plasma display device which uses a plasma display panel (PDP). A conventional PDP includes electrodes on two facing substrates, wherein the two substrates overlap at a predetermined interval. A discharge gas is injected between the two substrates, and the two substrates are sealed.

Since a plasma display device can be manufactured to be thinner than a cathode ray tube (CRT), a plasma display device can have a large screen with a small volume and light weight. Also, unlike other flat display devices such as liquid crystal displays (LCD), a plasma display device does not require an active element such as a transistor and has characteristics such as wide viewing angle and high brightness.

A plasma display device is manufactured by forming a PDP and mounting elements required for embodying the screen, such as a driving circuit connected to electrodes on the panel. The PDP is formed by forming conductive patterns and barrier ribs on two glass substrates and overlapping the two glass substrates with each other. The substrates are spaced from each other by the barrier ribs, and the edges of the glass substrates are sealed. Accordingly, it is difficult to directly mount a circuit element on the rear surface of a PDP. Thus, a chassis or a frame is used with the PDP such that a circuit substrate is mountable on the rear surface of the PDP and the fragile PDP is protected and supported.

The chassis is formed by attaching a reinforcement member having various shapes to a chassis base. For example, a reinforcement member having a stepped shape may be mounted on the edge of the chassis base to ensure a uniform strength of the chassis base. Alternatively, a separate reinforcement member may be mounted on a portion of the chassis base using a rivet, a screw, and a welder.

In general, the chassis base is made of iron or aluminum in order to ensure a strength requirement and to allow the chassis base to function as a heat sink and a ground base in the PDP.

In accordance with a recent increase in sizes of plasma display devices, the weight of a metal chassis base used in the chassis has increased, increasing the manufacturing cost of the metal chassis. Accordingly, the chassis must be thin and lightweight to produce a plasma display device having lower power consumption and high quality. However, there is a limit to thickness reduction of the metal chassis base which functions as the frame for mounting the panel and a protective circuit board.

In order to reduce the manufacturing cost of a plasma display device, development of a chassis material having low cost is required. Accordingly, a chassis made of plastic has been researched.

A plastic chassis of the plasma display device may be manufactured by replacing the metal chassis base with a plastic plate and forming a boss for mounting a circuit board on the plastic plate. In this structure, since the same boss as that used in the conventional metal chassis base is mounted on the chassis base and the circuit board is supported by the boss, the plastic chassis is manufactured by only replacing the existing metal plate with the plastic plate.

FIGS. 1 and 2 are a side view and a perspective view, respectively, schematically illustrating a conventional chassis base on which a support frame is mounted.

Conventionally, an ear type chassis base for supporting the corners of the panel is used. However, recently, a structure of forming a wall mount boss 21 on a chassis base 19 and fastening a support frame 25 to the wall mount boss 21 with a screw has been widely adopted, as shown in FIGS. 1 and 2. In this structure, the wall mount boss 21 is formed on the chassis base 19 and a reinforcement member (bracket) 23 into which the wall mount boss is inserted is fastened to the chassis base 19 using a tox method. The tox method is a method of overlapping two thin plates and applying pressure at one side of the plates such that a protrusion and a groove are formed in the plates when viewed at the contact surface. The reinforcement member 23 surrounds a portion of the sidewall of the boss 21 and has flanges at its ends which contact the chassis base 19 to facilitate coupling with the chassis base 19.

One end of the wall mount boss 21 is coupled to the chassis base 19 and another end is fastened to the support frame 25 by a screw 251. The support frame 25 may have various shapes, and functions as an intermediate cover in a plasma display module having a basic circuit. A screen controlling circuit or an operation circuit may be mounted at the rear side of the support frame 25 and a rear case of the plasma display device is provided at the rear side of the circuit. A guide stand hole 27 is formed in the lower side of the support frame 25, into which an upper end of a stand 30 for holding the plasma display device upright is inserted.

In order to manufacture the chassis and the support frame having the aforementioned structure, the chassis base 19, the wall mount boss 21, the reinforcement member (bracket) 23, and the support frame 25 are separately formed, the boss 21 being fastened to the chassis base 19 by a pressing method, the reinforcement member (bracket) 23 being fixed to the chassis base 19 and the boss 21, and the support frame 25 is fastened to the boss 21 with the screw 251.

In this structure, since the components are separately formed and then coupled with one another, the cost required for assembling the components in this manner is increased.

SUMMARY OF THE INVENTION

A plastic chassis for a display device is provided which can reduce the manufacturing cost of the display device. The display device may be a plasma display device.

According to one exemplary embodiment of the present invention, a plastic chassis for a display device includes a chassis base and a support frame integrally formed in plastic such that the chassis base and the support frame are joined at a periphery portion of the support frame and at least a portion of the support frame is spaced from the chassis base. A support joins the chassis base with the support frame. The chassis base and the support frame may be integrally formed by injection molding.

DETAILED DESCRIPTION OF THE INVENTION

Figure 1:
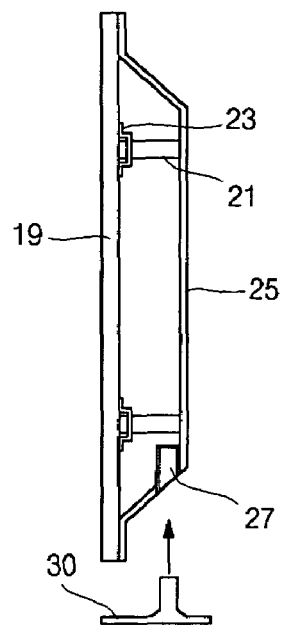
FIGS. 1 and 2 are a side view and a perspective view, respectively, schematically illustrating a conventional chassis base on which a support frame is mounted.
Figure 2:
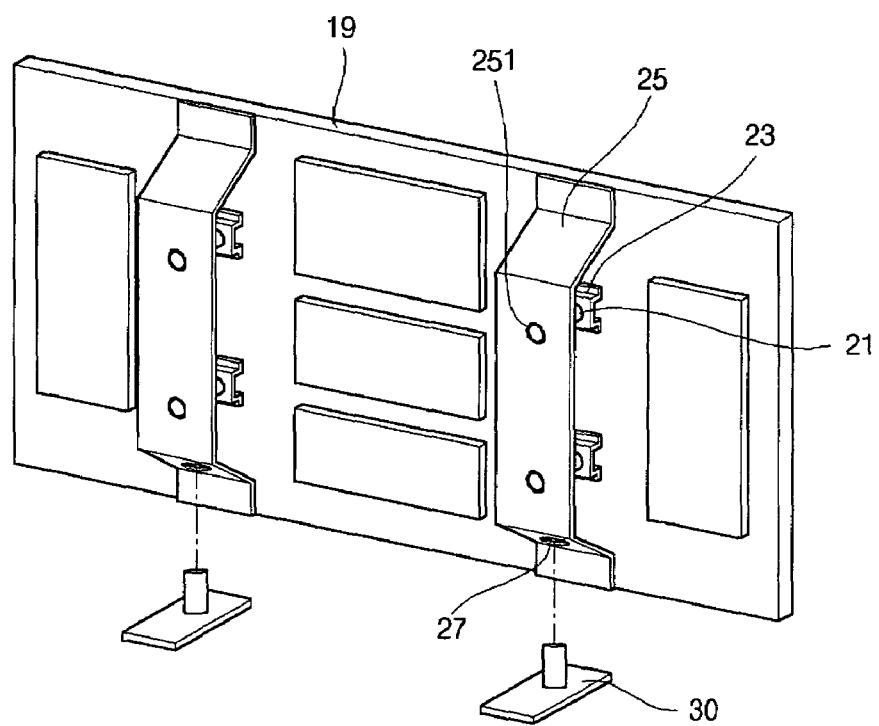
Figure 3:
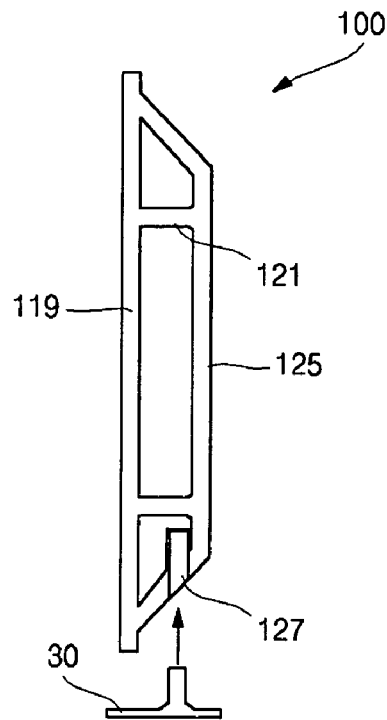
FIGS. 3 and 4 are a side view and a perspective view, respectively, illustrating a plastic chassis according to an embodiment of the present invention.
Figure 4:
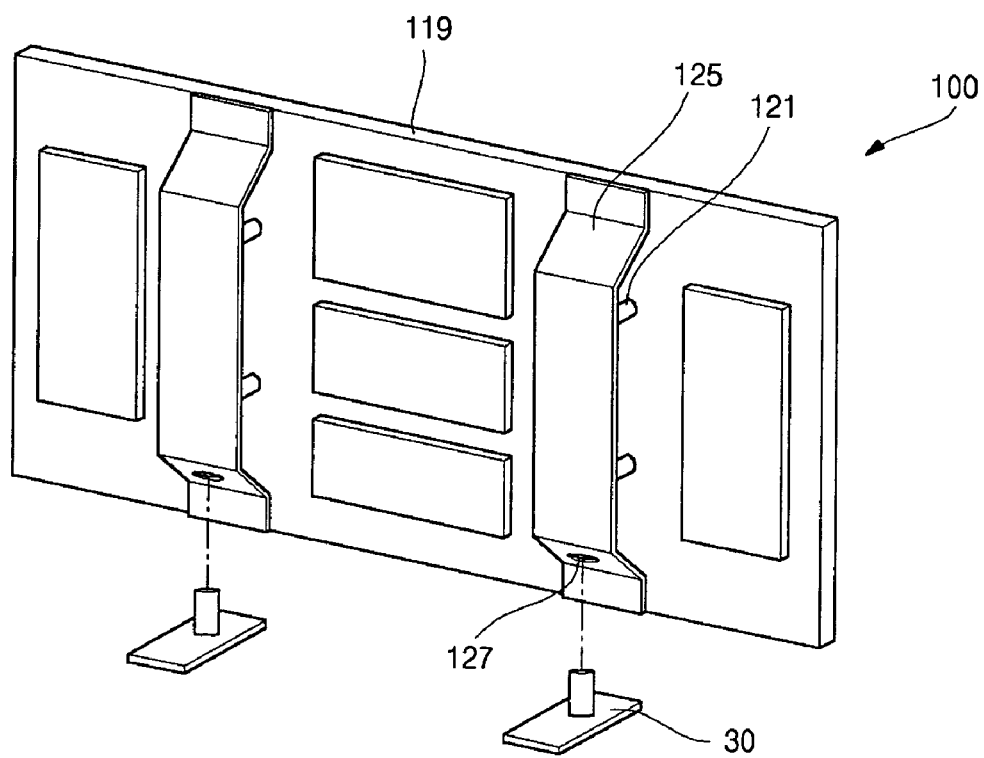

Referring to FIGS. 3 and 4, a support frame 125 and the chassis base 119 are integrally formed without using a separate coupling means. The support frame 125 has a wide band shape and is fixed at upper and lower sides of the chassis base 119 at either end of the support frame. Accordingly, a boss or a screw for coupling the elements is not necessary. In addition, as a support body, a plastic reinforcement pillar 121 is integrally formed between the chassis base 119 and the support frame 125 and functions as a boss.

A guide stand hole 127 is formed in a lower portion of the support frame 125 where the plasma display device is normally mounted on a guide stand 30.

The chassis 100 having the integrally formed chassis base 119 and support frame 125, has a structure such that casting mold for forming the plastic chassis by a pouring or molding method may be divided into at least two portions in accordance with the shape of the chassis to be formed, as would by typically understood by those skilled in the art.

It is possible to mold the support frame 125 or the reinforcement pillar 121 connected to the chassis base 119 at one time. Although not shown, a rib may be formed such that the chassis has a more stable structure. The chassis base may be formed together with a metal boss upon the injection molding. The chassis base has a plastic plate and a metal mesh or a metal plate provided in the plastic plate and is electrically connected with the boss.

Although not shown, the boss for mounting a protective circuit board may be formed together with the chassis base in the injection molding process of the chassis.

Figure 5:
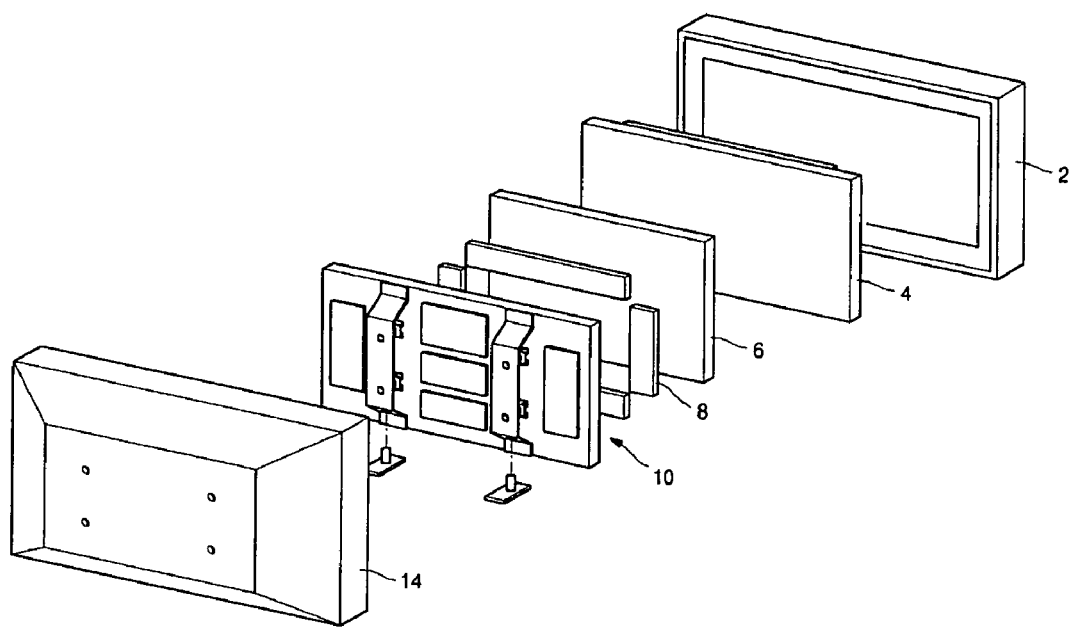
FIG. 5 is an exploded partial perspective view illustrating a plasma display device including the plastic chassis according to an embodiment of the present invention.

Referring to FIG. 5, the plasma display device according to the present embodiment includes a front case 2, a rear case 14, a panel 4, a thermal spreader sheet (TSS) 6, an adhesive member 8, a plastic chassis 10, a printed circuit board, and a ground plate.

The front case 2 is fastened to the rear case 14 such that the panel 4, the TSS 6, the printed circuit board, and the plastic chassis 10 mounted therein are protected from external contamination. Additionally, impact, noise and vibration generated upon operating the plasma display panel are prevented. The front case 2 has a light transmitting portion for emitting light output from the panel 4. The light transmitting portion may include a filter assembly (not shown). The filter assembly includes a reflection film for preventing deterioration of visibility, an electromagnetic shielding layer for shielding the electromagnetic wave generated upon operation, and a filter for absorbing unnecessary light. A plurality of dissipating holes for dissipating the heat may be formed in the rear case 14.

The panel 4 includes an upper substrate on which a plurality of scan electrodes and a plurality of sustain electrodes are formed. The panel 4 also includes a lower substrate having a plurality of address electrodes, the address electrodes formed perpendicular to the scan electrodes and the sustain electrodes. Phosphor layers are disposed between the upper substrate and the lower substrate. In addition, between the upper substrate and the lower substrate, barrier ribs for defining discharge cells are formed at intersections between the electrodes. Moreover, inert gases such as Ne, Xe, He, or Ar or a mixture thereof are filled between the upper substrate and the lower substrate. Visible rays are generated by exciting a phosphor using ultraviolet rays generated by a discharge between the scan electrodes and the sustain electrodes and the ratio of generating the visible rays is controlled to display a desired image. An upper dielectric layer and a protective layer may be further formed on the upper substrate and a lower dielectric layer may be further formed on the lower substrate.

The TSS 6 is inserted between the panel 4 and the plastic chassis 10, and serves to uniformly dissipate the heat generated in the panel 4 upon operating the plasma display device and to prevent the temperature of the panel 4 from rapidly increasing. The TSS 6 makes the temperature distribution of the panel 4 uniform to be prevented from being damaged or malfunctioning due to a local temperature difference in the panel 4.

The adhesive member 8 fixes the TSS 6 to the plastic chassis 10. The adhesive member 8 has a band shape or a frame shape and is formed at the edges of the TSS 6 as shown in FIG. 5. The adhesive member 8 may be attached to the rear surface of the rear substrate of the panel 4 to fix the panel 4 to the plastic chassis 10. The adhesive member 8 may be an adhesive, an adhesive sheet, or an adhesive tape. The adhesive members 8 are attached to the TSS 6 at a predetermined distance such that air is allowed to flow into or out of the TSS to dissipate the heat delivered from the panel 4 to the TSS.

The plastic chassis 10 is fixed with the panel 4 or the TSS 6 by the adhesive member 8 and serves to dissipate the heat from the panel 4, a tape carrier package, and the printed circuit board. The plastic chassis 10 supports and fixes the printed circuit board by a fastening means such as a boss or a screw. Since the plastic chassis 10 has thermal conductivity lower than that of the metal chassis base, the plastic chassis 10 is spaced apart from the TSS 6 to allow heat dissipation from the TSS 6. In addition, a ground plate for grounding the driving units may be fixed to the plastic chassis 10.

A system circuit unit for driving the PDP is formed on the printed circuit board. The system circuit unit includes a power supply unit for supplying power, and an address driving unit, a scan driving unit and a sustain driving unit for supplying driving signals to the electrodes of the panel 4. The printed circuit board includes a power supply unit board on which the power supply unit is formed, a scan driving unit board on which the scan driving unit is formed, a sustain driving unit board on which the sustain driving unit is formed, and a logic board on which a portion of the address driving unit and a controlling circuit such as a timing controller are formed. In addition, a driving buffer board is provided among the panel 4, the logic board, and the scan driving unit board, and the driving signals of the logic board and the scan driving unit are supplied to the panel 4 through the driving buffer board. Furthermore, the address driving unit, the scan driving unit, and the sustain driving unit are connected with the electrodes by a flexible printed cable/circuit (FPC) or a tape carrier package (TCP) on which a driving chip is mounted (not shown).

Moreover, the driving units of the printed circuit board 10, i.e., the address driving unit, the scan driving unit, and the sustain driving unit include separate intelligent power modules (IPM). These intelligent power modules convert the power supplied by the power supply unit into a signal voltage which can be supplied to the electrodes by control of the respective driving units. The intelligent power module mounted on the address driving unit generates an address signal supplied to the address electrode by control of the address driving unit and the timing controller. A plurality of dissipating plates (not shown) for dissipating the heat generated upon driving the plasma display panel may be included in the intelligent power modules and the power supply unit.

Further, the ground plate (not shown) may be formed and a conductive path for providing a ground base to the driving unit may be provided.

In an exemplary embodiment of the present invention, the support frame integrally formed with the chassis base is previously mounted before mounting the driving circuit board. Since the support frame may cause inconvenience when coupling the panel with the driving circuit board, the support frame is mounted such that the driving circuit board contacts the support frame.

According to the present invention, it is possible to integrally form a support frame, a chassis base, a bracket, and a boss. Accordingly, the cost required for separately forming the components and coupling the components to one another can be reduced. Moreover, it is possible to reduce a failure generated by coupling a plurality of components to one another.

While the present invention has been particularly shown and described with reference to exemplary embodiments thereof, it will be understood by those skilled in the art that various changes in form and details may be made therein without departing from the spirit and scope of the invention as defined by the appended claims. Therefore, the scope of the invention is defined by the appended claims, and all differences within the scope will be construed as being included in the present invention.

What is claimed is:

1. A display panel comprising:
   a panel for displaying an image, the panel comprising:
      barrier ribs and electrodes between two substrates, wherein edges of each of the two substrates are sealed together, and
      a discharge gas between the two substrates;
   a circuit unit for applying an image signal to the electrodes; and
   a plastic chassis mounted at a rear side of the panel, the plastic chassis comprising:
      a plastic chassis base, and
      a support frame having at least a portion spaced from the plastic chassis base, wherein the plastic chassis base and the support frame are integrally formed.

2. The display panel according to claim 1, further comprising a support joining the plastic chassis base with the support frame, wherein the support is integrally formed with the plastic chassis base.

3. The display panel according to claim 2, wherein the support is a wall-hanging boss.

4. The display panel according to claim 1, wherein the plastic chassis base and the support frame are integrally molded.

5. The display panel according to claim 4, further comprising a metal boss joining the plastic chassis base with the support frame.

6. The display panel according to claim 1, wherein the plastic chassis base and the support frame are injection molded.

7. The display panel according to claim 1, wherein the support frame has a guide stand hole for mounting the support frame onto a guide stand.

8. The display panel according to claim 1, wherein the display panel is a plasma display panel.

9. A plastic chassis for a display device, the plastic chassis comprising a plastic chassis base and a support frame integrally formed with the plastic chassis base, wherein at least a portion of the support frame is spaced from the chassis base.

10. The plastic chassis according to claim 9, further comprising a support joining the plastic chassis base with the support frame, wherein the support is integrally formed with the chassis base.

11. The plastic chassis according to claim 10, wherein the support is a wall-hanging boss.

12. The plastic chassis according to claim 9, wherein the plastic chassis base and the support frame are integrally molded.

13. The plastic chassis according to claim 9, wherein the plastic chassis base and the support frame are integrally injection molded.

14. The plastic chassis according to claim 9, further comprising a metal boss joining the plastic chassis base with the support frame, and wherein the plastic chassis base and the support frame are integrally molded.

15. The plastic chassis according to claim 9, wherein the support frame has a guide stand hole for mounting the support frame onto a guide stand.

16. The plastic chassis according to claim 9, wherein the display panel is a plasma display panel.

* * * * *